United States Patent [19]

Naghshineh

[11] Patent Number: 4,994,691
[45] Date of Patent: Feb. 19, 1991

[54] TTL-TO-CML TRANSLATOR CIRCUIT

[75] Inventor: Kianoosh Naghshineh, Menlo Park, Calif.

[73] Assignee: Advanced Micro Devices, Inc., Sunnyvale, Calif.

[21] Appl. No.: 509,649

[22] Filed: Apr. 16, 1990

[51] Int. Cl.[5] .................... H03K 17/092; H03K 17/16
[52] U.S. Cl. ..................................... 307/475; 307/443; 307/455; 307/296.6
[58] Field of Search ............. 307/475, 443, 455, 296.6

[56] References Cited

U.S. PATENT DOCUMENTS

| | | | |
|---|---|---|---|
| 4,656,370 | 4/1987 | Kanuma | 307/443 |
| 4,698,527 | 10/1987 | Matsumoto | 307/475 |
| 4,806,800 | 2/1989 | Khan | 307/475 |
| 4,857,776 | 9/1989 | Khan | 307/455 |
| 4,883,978 | 11/1989 | Ohshima et al. | 307/443 |

*Primary Examiner*—David Hudspeth
*Assistant Examiner*—Andrew Sanders
*Attorney, Agent, or Firm*—Davis Chin

[57] ABSTRACT

A TTL-to-CML translator circuit includes a TTL input stage (20), a translation chain (22), a first CML differential pair (24), a level shifter (26), and a second CML differential pair (28). The first CML differential pair (24) is coupled between a TTL ground potential (GTTL) and a negative supply potential (VEE). The second CML differential pair (28) is connected between a CML ground potential (GCML) and the negative supply potential. The level shifter (26) serves to electrically isolate the TTL ground potential and the CML ground potential, thereby producing relatively noise free CML-compatible output signals.

20 Claims, 2 Drawing Sheets

TTL-TO-CML TRANSLATOR CIRCUIT

BACKGROUND OF THE INVENTION

This invention relates generally to logic level translators and more particularly, it relates to a logic translator circuit for converting transistor-transistor-logic (TTL) level signals to current-mode-logic (CML) level signals which have a higher speed of operation, a reduction in power dissipation and immunity from ground bounce noise.

As is generally well known in the art, various types of digital logic circuitry are widely utilized in the area of computer data processing systems in different parts of the processing system. In order to transfer data from one part of the processing system having one logic type (i.e., TTL) of integrated circuit devices to another part having another logic type (i.e., CML/ECL) of integrated circuit devices, there is often required a translation from the one logic type to the other logic type. Since many of these processing systems are designed with both TTL and CML/ECL logic circuits, there has arisen a need in the industry for interface circuits such as TTL-to-CML/ECL translators so that these two different types of logic circuits will be compatible with each other.

TTL logic circuits typically operate on logic signal levels below +0.8 volts and above +2.0 volts while CML logic circuits typically operate on different logic levels between −1.0 to −1.6 volts. While the precise levels utilized in the CML/ECL logic circuits differ among manufacturers, the voltage swing between the two CML logic levels is commonly less than the voltage swing between the two TTL logic levels. Further, the TTL circuit makes use of a positive power source voltage VCC (i.e., +5.0 volts) and a ground potential TGND). On the other hand, the CML circuit makes use of a negative power supply voltage VEE (i.e., −5.2 volts) and a ground potential CGND). Both ground potentials TGND and CGND are typically at zero volts.

Prior art translators use diodes and other semiconductor devices to obtain a fixed voltage drop to translate from one type of binary signal level to another type of binary signal level. However, these prior art translators suffer from the disadvantage in that they used a common ground which is shared by both the TTL input and CML output signals. For example, the TTL input signals and the CML output signals would share the same bus line as a common ground. Such a logic level translator 10 of the prior art is shown in FIG. 1 and has been labeled "Prior Art." This prior art translator can be found in "Analysis and Design of Digital Integrated Circuits" written by David A. Hodges and Horace G. Jackson, p. 296, published in 1983 by McGraw-Hill, Inc.

This prior art translator 10 includes a TTL input stage 12 and a CML output stage 14. The TTL input stage 12 is coupled between a positive power supply voltage VCC (i.e., +5.0 volts) and a ground potential GND. The TTL input stage 12 receives TTL logic levels at input nodes A and B. The CML output stage 14 is coupled between a negative power supply potential VEE (i.e., −5.2 volts) and the same ground potential (GND). The CML output stage 14 can deliver both an OR output at the collector of the transistor Q5 and a NOR output at the collector of the transistor Q4. As a result, any TTL currents flowing in the commonly shared ground bus (GND) will produce noise signals (referred to as ground bounce noise) in the CML output stage 14 of the translator. Also, any variations in the positive power supply potential VCC used in the TTL input stage 12 would be coupled to the CML output stage 14 of the translator. Further, the input threshold of the TTL input stage depends directly on the value of the voltage $V_r$ at the base of the transistor Q5 and the value of the voltage $V_{BB}$ at the base of the transistor Q2. Moreover, the use of a resistor R3 to perform a level shifting limits the transient current, thereby causing propagation delays which reduces the speed of operation of the translator.

Accordingly, it would be desirable to provide an improved TTL-to-CML translator circuit which is immune to ground bounce noise but yet has a higher switching speed with reduced power dissipation. The logic level translator circuit of the present invention represents an improvement over the translator circuit 10 of FIG. 1 which isolates the TTL and CML ground bus lines so as to reduce the noise that may be transferred between the TTL ground bus and the CML ground bus.

SUMMARY OF THE INVENTION

Accordingly, it is a general object of the present invention to provide an improved TTL-to-CML translator circuit which overcomes the disadvantages of the prior art devices.

It is an object of the present invention to provide a logic translator circuit for converting TTL logic level signals to CML logic level signals which has a higher speed of operation, a reduction in power dissipation, and immunity from ground bounce noise.

It is another object of the present invention to provide a TTL-to-CML translator circuit which provides isolation between a TTL ground bus and a CML ground bus so as to reduce the noise that may be transferred therebetween.

It is still another object of the present invention to provide a TTL-to-CML translator circuit which includes a TTL input transistor, a translation chain, a first CML differential pair, a level shifter, and a second CML differential pair.

In accordance with these aims and objectives, the present invention is concerned with the provision of a logic translator circuit for converting TTL logic level signals into CML logic level signals which includes a TTL input transistor, a translation chain, a first CML differential pair, a level shifter, and a second CML differential pair. The TTL input transistor has its base coupled to an input terminal for receiving TTL logic level signals, its collector connected to a positive power supply potential, and its emitter connected to an output node. The translation chain is formed of a plurality of series-connected diodes. One end of the translation chain is connected to the output node. The first CML differential pair is formed of first and second input transistors having their emitters connected together. The first input transistor has its collector connected to a TTL ground potential via a first load resistor and its base connected to the other end of the translation chain. The second input transistor has its collector connected to the TTL ground potential via a second load resistor and its base connected to a reference potential. A first current source is connected between the common emitters of the first and second input transistors and a negative supply potential.

A level shifter is formed of first and second emitter follower transistors. The first emitter follower transistor has its collector connected to the TTL ground potential and its base connected to the collector of the second input transistor. The second emitter follower transistor has its collector connected to the TTL ground potential and its base connected to the collector of the first input transistor. The second CML differential pair is formed of third and fourth input transistors having their emitters connected together. The third input transistor has its collector connected to a CML ground potential via a third load resistor and its base coupled to the emitter of the second emitter follower transistor. The CML ground potential is electrically isolated from the TTL ground potential. The fourth input transistor has its collector connected to the CML ground potential via a fourth load resistor and its base coupled to the emitter of the first emitter follower transistor. A second current source is connected between the common emitters of the third and fourth input transistors and the negative supply potential. The collector of the third input transistor is connected to a first output terminal for providing a true CML logic level signal, and the collector of the fourth input transistor is connected to a second output terminal for providing a complementary CML logic level signal.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
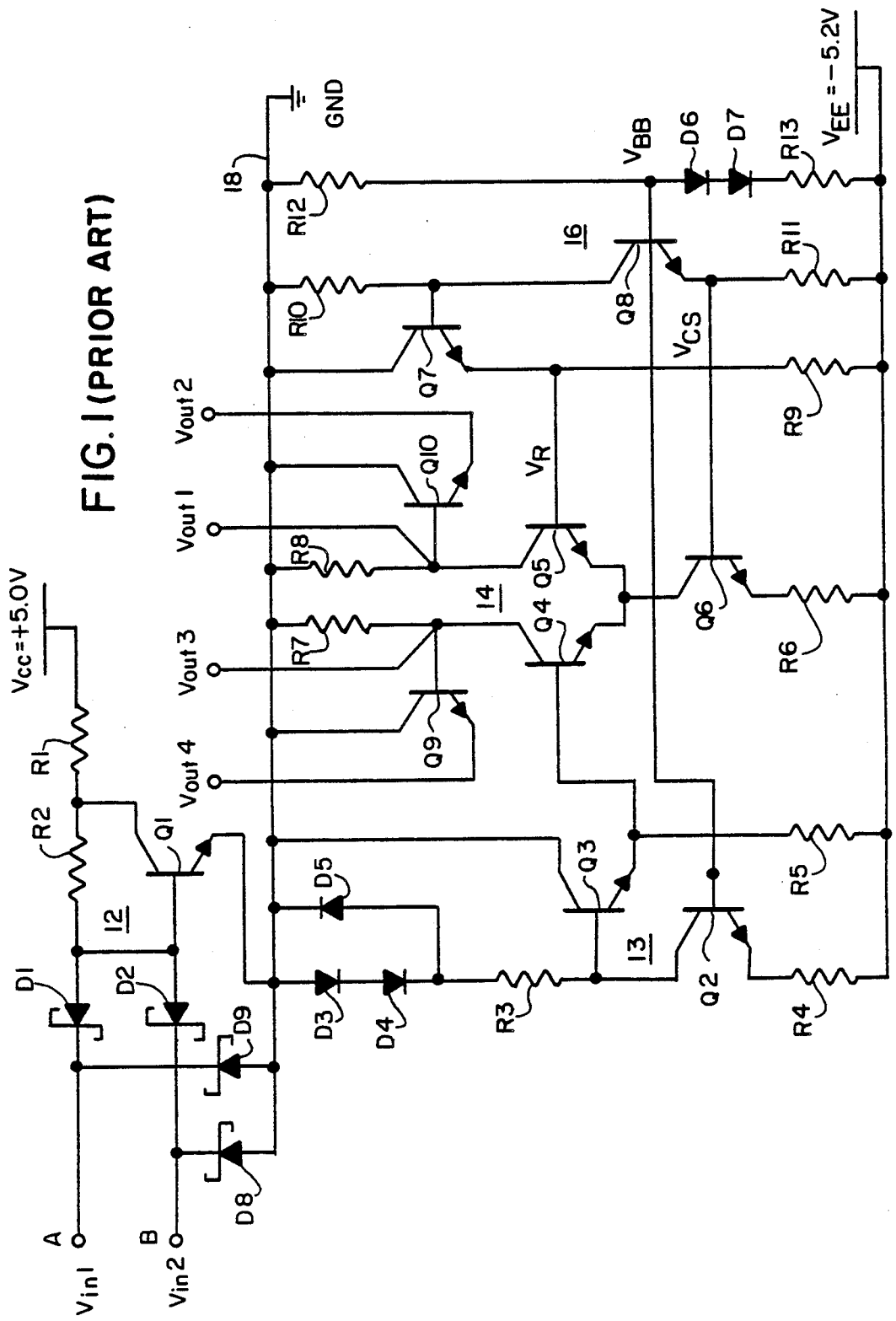
FIG. 1 is a detailed schematic diagram of a TTL-to-CML logic translator circuit of the prior art.

Referring now in detail to the drawings, there is shown in FIG. 1 a schematic circuit diagram of a conventional prior art TTL-to-CML translator device 10 which is used for converting TTL logic level signals to CML-compatible logic level signals. The translator device 10 is comprised of a TTL input stage 12, a level shifter 13, a CML output stage 14 and a reference voltage generator circuit 16. The TTL input stage 12 consists of diodes D1, D2, D8, D9; resistors R1, R2; and a transistor Q1. The input stage 12 is coupled between a positive power supply potential VCC (+5.0 volts) and a ground potential GND on a ground bus line 18. The input stage receives TTL-level data input signals $V_{in1}$ and $V_{in2}$ respectively on its nodes A and B. The level shifter 13 is formed of diodes D3-D5; resistors R3, R4, R5; and transistors Q2, Q3.

The CML/ECL output stage 14 includes an output differential pair formed of transistors Q4, Q5; a current source formed of a transistor Q6 and a resistor R6; load resistors R7, R8; and emitter follower transistors Q9, Q10. The output stage is coupled between a negative power supply potential VEE (−5.2 volts) and the same ground potential GND on the common bus line 18. A CML-level output voltage $V_{out1}$ representing the AND logic of the two input signals $V_{in1}$ and $V_{in2}$ appears at collector of the transistor Q5. A corresponding ECL-level output voltage $V_{out2}$ appears at the emitter of the transistor Q10. A CML-level output signal $V_{out3}$ representing the NAND logic of the two input signals at $V_{in1}$ and $V_{in2}$, appear at the collector of the transistor Q4. A corresponding ECL-level output signal $V_{out4}$ appears at the emitter of the transistor Q9.

The reference voltage generator circuit 16 includes diodes D6, D7; resistors R9-R13; and transistors Q7, Q8. A first reference voltage $V_R$ is provided at the junction of the emitter of the transistor Q7 and the base of the transistor Q5. A second reference voltage $V_{CS}$ is provided at a junction of the emitter of the transistor Q8 and the base of the transistor Q6. A third reference voltage $V_{BB}$ is provided at the junction of the anode of the diode D6 and the bases of the transistors Q2 and Q8.

It will be noted that the ground bus line 18 is shared by the TTL input stage 12 and the CML output stage 14. The switching of the two input signals $V_{in1}$ and $V_{in2}$ in the input stage 12 may cause current spikes or noise to appear on the common ground bus line 18, sometimes referred to as "ground bounce noise." As a result, this noise will be transferred to the CML output stage 16 which will adversely affect the CML-level output signals.

Figure 2:
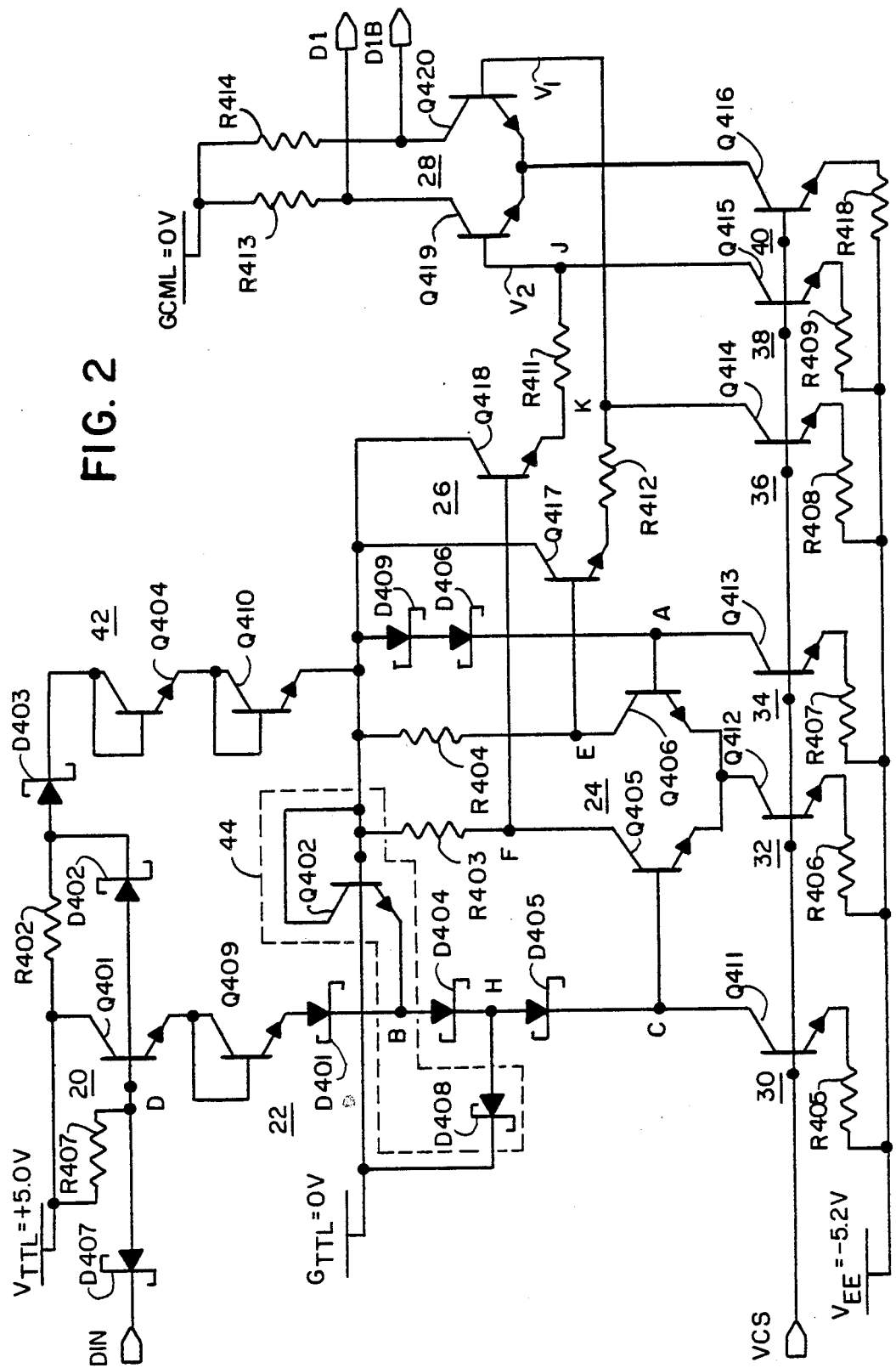
FIG. 2 is a detailed schematic diagram of a TTL-to-CML translator circuit, constructed in accordance with the principles of the present invention.

In FIG. 2 of the drawings, there is shown a schematic circuit diagram of a TTL-to-CML translator device 110 which is constructed in accordance with the principles of the present invention. The translator device 110 is comprised of a TTL input stage 20, a translator chain 22, a first CML differential pair 24, a level shifter 26, and a second CML differential pair 28. The translator device 110 further includes a plurality of constant current sources 30-40. A TTL level signal applied to input terminal Din is converted or translated into a CML level signal at output terminals D1 and D1B. It will be noted that the TTL ground GTTL and the CML ground GCML are isolated by the level shifter 26. Further, this isolation between the TTL ground and the CML ground coupled with the use of the second CML differential pair 28 serves to greatly reduce any noise that appears on the TTL ground bus GTTL from being transferred to the CML ground bus GCML. As a result, this translation device 110 is capable of producing relatively noise free CML-compatible output signals at the output terminals D1 and D1B.

The TTL input stage 20 is formed of an input transistor Q401, a Schottky diode D407, and a resistor R401. The transistor Q401 has its collector connected to a positive power supply potential VTTL, which is typically at +5.0 volts. The base of the transistor Q401 is connected to the anode of the Schottky diode D407 and to one end of the resistor R401. The other end of the resistor R401 is also connected to the positive supply potential VTTL. The cathode of the diode D407 is connected to the input terminal Din.

The translation chain 22 is formed of a diodeconnected transistor Q409 and Schottky diodes D401, D404, and D405. The emitter of the transistor Q401 is connected to the base-to-collector terminal of the transistor Q409. The emitter of the transistor Q409 is tied to the anode of the diode D401. The cathode of the diode D401 is tied to the anode of the diode D404. The cathode of the diode D404 is joined to the anode of the diode D405. The cathode of the diode D405 is joined to the base of an input transistor Q405 in the first differential pair 24 and to the current source 30. The current source 30 is formed of a transistor Q411 and a resistor R405. The transistor Q411 has its collector also connected to the base of the transistor Q405, its base connected to a reference voltage VCS, and its emitter connected to one end of the resistor R405. The other end of the resistor R405 is connected to a negative power supply potential VEE, which is typically at −5.2 or −4.5 volts.

The first CML or translator differential pair 24 includes the first input transistor Q405 and a second input or reference transistor Q406, and load resistors R403, R404. The input transistor Q405 has its collector connected to one end of the load resistor R403, and the second input transistor Q406 has its collector connected to one end of the load resistor R404. The other ends of the resistors R403 and R404 are connected to a TTL ground bus line GTTL which is typically at zero volts. The emitters of the input transistors Q405 and Q406 are connected together and to the current source 32. The current source 32 is formed of a transistor Q412 and a resistor R406. The transistor Q412 has its collector connected to the common emitters of the input transistors Q405 and Q406, its base connected to the reference voltage VCS, and its emitter connected to one end of the resistor R406. The other end of the resistor R406 is connected to the negative power supply potential VEE.

A reference generator formed by a pair of seriesconnected Schottky diodes D406 and D409 is interconnected between the TTL ground bus line GTTL and the base of the second input transistor Q406. In particular, the anode of the diode Q409 is connected to the bus line GTTL, and the cathode of the diode D406 is connected to the base of the transistor Q406. The diodes D406 and D409 are selected so that their operating characteristics are substantially identical to the diodes D404 and D405. The cathode of the diode D406 is also connected to the current source 34. The current source 34 is identical to the current source 30 so as to eliminate matching errors and is formed of a transistor Q413 and a resistor R407. The transistor Q413 has its collector connected to the base of the transistor Q406, its base connected to the reference voltage VCS, and its emitter connected to one end of the resistor R407. The other end of the resistor R407 is connected to the negative power supply potential VEE.

Assuming that a voltage drop of 0.5 volts across a forward-biased Schottky diode, a reference voltage $V_{REF}$ will be developed at the base (node A) of the second input transistor Q406 which is approximately 1.0 volts below the bus line GTTL or −1.0 volts. Thus, this will also be the trip voltage on the base (node C) of the first input transistor Q405. Further, the voltage at the node B will be at zero volts or virtual ground since the voltage $V_B$ is two Schottky diode drops above the voltage $V_C$ at the base of the transistor Q405 and is given by:

$$V_B = V_{C(Q405)} + V_{SH(D405)} + V_{SH(D404)}$$
$$= -1.0 \text{ volt} + 0.5 \text{ volt} + 0.5 \text{ volt}$$
$$= 0 \text{ volt}$$

As a result, it can be seen that threshold voltage $V_{TH}$ at the input terminal Din is referenced to the TTL ground bus line GTTL and is calculated to be equal to $2V_{BE}$ as follows:

$$V_{TH} = V_B + V_{SH(D401)} + V_{BE(Q409)} + V_{BE(Q401)} - V_{SH(D407)}$$
$$= 0 \text{ volt} + 0.5 \text{ volt} + 2V_{BE} - 0.5 \text{ volt}$$
$$= 2V_{BE}$$

Since there is no resistor in the translation chain 22, such as the resistor R3 in the prior art of FIG. 1, there is achieved a higher speed of operation. This higher speed is obtained by eliminating of this resistor R3 which will allow the current in the translation chain 22 not to be limited, and all of this current will be available to charge/discharge the capacitance at the base of the input transistor Q405. Moreover, this serves to reduce the amount of power dissipation.

The level shifter 26 consists of a first emitter follower transistor Q417, a first emitter resistor R412, a second emitter follower transistor Q418, and a second emitter resistor R411. The transistor Q417 has its collector connected to the TTL ground bus line GTTL, its base connected to the collector of the transistor Q406 and its emitter connected to one end of the resistor R412. The other end of the resistor R412 is connected to the current source 36. The current source 36 is formed of a transistor Q414 and a resistor R408. The transistor Q414 has its collector connected to the other end of the resistor R412, its base connected to the reference voltage VCS, its emitter connected to one end of the resistor R408. The other end of the resistor R408 is connected to the negative power supply potential VEE.

Similarly, the transistor Q418 has its collector connected to the TTL ground bus line GTTL, its base connected to the collector of the transistor Q405, and its emitter connected to one end of the resistor R411. The other end of the resistor R411 is connected to the current source 38. The current source 38 is formed of a transistor Q415 and a resistor R409. The transistor Q415 has its collector connected to the other end of the resistor R411, its base connected to the reference voltage VCS, and its emitter connected to one end of the resistor R409. The other end of the resistor R409 is connected to the negative power supply potential VEE.

The transistor Q417 and the resistor R412 acts as buffer and level shifts the voltage at the collector (node E) of the transistor Q406 to a new voltage $V_1$ at node K. This voltage $V_1$ is applied to the base of the input transistor Q420 in the second CML differential pair 28. In a similar manner, the transistor Q418 and the resistor R411 serves as a buffer and level shifts the voltage at the collector (node F) of the transistor Q405 to a new voltage $V_2$ at node J. The voltage $V_2$ is applied to the base of the transistor Q419 in the second CML differential pair. The common-mode voltage of voltages $V_1$ and $V_2$ (their center value) is centered between its maximum allowable range which is dictated by the saturation of the switching transistors Q419, Q420 or the current source transistor Q416. This scheme will allow for the maximum change in the common-mode voltage of $V_1$ and $V_2$ (which is really simply the difference between the ground potentials GTTL and GCML). The ground bounce noise occurring on the TTL ground bus line GTTL is added to both the voltages $V_1$ and $V_2$. By providing the second CML differential pair 28, which responds to the difference between the values of the voltages $V_1$ and $V_2$, and separating the ground potentials GTTL and GCML, the effect of the ground bounce noise have been eliminated from the CML ground bus line GCML and the output terminals D1 and D1B.

The second CML or output differential pair 28 is comprised of input transistors Q419 and Q420 and load resistors R413 and R414. The input transistor Q419 has its collector connected to one end of the resistor R413 and to the output terminal D1 for providing a true CML-compatible signal. The input transistor Q420 has its collector connected to one end of the resistor R414 and to the output terminal D1B for providing a complementary CML-compatible signal. The other ends of the resistors R413 and R414 are connected to the CML ground bus line GCML. The emitters of the transistors Q419 and Q420 are connected together and to the current source 40. The current source 40 is formed of a transistor Q416 and a resistor R410. The transistor Q416 has its collector connected to the common emitters of the input transistors Q419 and Q420, its base connected to the reference voltage VCS, and its emitter connected to one end of the resistor R410. The other end of the resistor R410 is connected to the negative power supply potential VEE.

The translator device 110 further includes an input clamp circuit 42 formed of a pair of Schottky diodes D402, D403 and a pair of diode-connected transistors Q404, Q410, and a resistor R402. The clamp circuit 42 serves to limit the upper boundary on the voltage at the base of the input transistor Q401 or node D from rising above $2V_{SH}+2V_{BE}$. Consequently, the voltages at the corresponding nodes D, B and H can only go positive by one Schottky voltage drop $V_{SH}$ relative to their threshold values. A swing clamp 44 is formed of a clamping transistor Q402 and a clamping diode D408. The clamping transistor Q402 is provided to limit the voltage between the TTL ground bus line GTTL and the node B. The transistor Q402 has its base and collector connected to the TTL ground bus line GTTL and its emitter connected to the node B. The clamping diode D408 serves to limit the transient voltage at the Node H with respect to the TTL ground bus line GTTL. The anode of the diode D408 is connected to the node H, and the cathode of the diode D408 is connected to the TTL ground bus line GTTL. As a result, the travel at the nodes H and C will be definitely clamped to one Schottky diode drop $V_{SH}$ in the positive direction and one $V_{BE}$ drop in the negative direction from their threshold values. Therefore, since the swing at the node C is minimized, a higher speed of operation is achieved. Further, the clamping diode D408 is only a transient clamp, and the clamp circuit 42 will act to limit the swing in the positive direction on a DC basis.

In operation, when a TTL signal below +0.8 volts representing a binary zero is applied to the input terminal Din, the voltages at the base and emitter of transistor Q401 will drop below their threshold values. As a result, the voltage at the base (node C) of the transistor Q405 will be more negative than the voltage $V_{REF}$ at the base (node A) of the transistor Q406. Therefore, the transistor Q406 will be rendered conductive and the transistor Q405 will be rendered non-conductive. The voltage drop across the resistor R404 provides a voltage of approximately −0.350 volts at node E which will produce a lower-than threshold voltage at the node K. Since the transistor Q405 is non-conductive, the voltage at node F will be zero volts, which will produce a higher-than threshold voltage at the node J. Further, since the voltage at the base (node J) of the transistor Q419 will be less negative than the voltage at the base (node K) of the transistor Q420, the transistor Q419 will be turned on and the transistor Q420 will be turned off. The voltage drop across the resistor R413 will provide a voltage of approximately −0.350 volts at the collector of the transistor Q419 or the output terminal D1 which represents a binary zero for the true CML-compatible signal. The output terminal D1B has the complement of the voltage at the terminal D1 and is at a voltage of zero volts or a binary one for the complementary CML-compatible signal.

When a TTL signal above +2.0 volts representing a binary one is applied to the input terminal Din, the base and emitter voltages of transistor Q401 will rise above their threshold values. As a result, the voltage at the base (node C) of the transistor Q405 will be less negative than the reference voltage $V_{REF}$ at the base (node A) of the transistor Q406. Therefore, the transistor Q405 will be rendered conductive and the transistor Q406 will be non-conductive. The voltage drop across the resistor R403 provides a voltage drop of approximately −0.350 volts at node F which decreases the base and emitter voltages of the transistor Q418 below their threshold values. Since the transistor Q406 is non-conductive, the voltage at the node E will be zero volts, which increases the base and emitter voltages of the transistor Q417 above their threshold values. Further, since the voltage at the base (node K) of the transistor Q420 will be less negative than the voltage at the base (node J) of the transistor Q419, the transistor Q420 will be on and the transistor Q419 will be off. The voltage drop across the resistor R414 provides a voltage of approximately −0.350 volts at the collector of the transistor Q420 or the output terminal D1B, which represents a binary zero for the complementary CML-compatible signal. The output terminal D1 has the complement of the voltage at the terminal D1B and is at a voltage of zero volts or a binary one for the true CML-compatible signal.

From the foregoing detailed description, it can thus be seen that the present invention provides an improved logic translator circuit for converting TTL logic level signals to CML logic level signals which includes a TTL input stage, a translation chain, a first CML differential pair, a level shifter, and a second CML differential pair. The level shifter serves to isolate electrically a TTL ground potential and a CML ground potential in order to produce relatively noise free CML-compatible output signals at the output terminals. Further, the translator circuit of the present invention has a higher speed of operation and a reduction in power dissipation.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A logic translator circuit for converting TTL logic level signals into CML logic signals comprising:

a TTL input transistor (Q401) having its base coupled to an input terminal for receiving TTL logic level signals, its collector connected to a positive supply potential (VTTL), and its emitter connected to an internal node;

a translation chain (22) formed of a plurality of series-connected diodes, one end of said translation chain being connected to the internal node;

a first CML differential pair (24) formed of first and second input transistors (Q405, Q406) having their emitters connected together;

said first input transistor (Q405) having its collector connected to a TTL ground potential (GTTL) via a first load resistor (R403) and its base connected to the other end of said translation chain;

said second input transistor (Q406) having its collector connected to said TTL ground potential via a second load resistor (R404) and its base connected to a reference voltage;

a first current source (32) connected between the common emitters of said first and second input transistors (Q405, Q406) and a negative supply potential (VEE);

a level shifter (26) formed of first and second emitter follower transistors (Q417, Q418), said first emitter follower transistor (Q417) having its collector connected to said TTL ground potential and its base connected to the collector of said second input transistor (Q406), said second emitter follower transistor (Q418) having its collector connected to said TTL ground potential and its base connected to the collector of said first input transistor (Q405);

a second CML differential pair (28) formed of third and fourth input transistors (Q419, Q420) having their emitters connected together;

said third input transistor (Q419) having its collector connected to a CML ground potential (GCML) via a third load resistor (R413) and its base coupled to the emitter of said second emitter follower transistor (Q418), said CML ground potential being electrically isolated from said TTL ground potential;

said fourth input transistor (Q420) having its collector connected to said CML ground potential via a fourth load resistor (R414) and its base coupled to the emitter of said first emitter follower transistor (Q417);

a second current source (40) connected between the common emitters of said third and fourth input transistors (Q419, Q420) and said negative supply potential; and the collector of said third input transistor (Q419) being connected to a first output terminal for providing a true CML-compatible signal and the collector of said fourth input transistor (Q420) being connected to a second output terminal for providing a complementary CML-compatible signal.

2. A logic translator circuit as claimed in claim 1, wherein said translation chain (22) is comprised of a diode-connected transistor (Q409), a first Schottky diode (D401), a second Schottky diode (D404), and a third Schottky diode (D405), said diode-connected transistor (Q409) having its base and collector connected to said emitter of said TTL input transistor (Q401) and its emitter connected to the anode of said first Schottky diode (D401), said first Schottky diode (D401) having its cathode connected to the anode of said second Schottky diode (D404), said second Schottky diode (D404) having its cathode connected to the anode of said third Schottky diode (D405), said third Schottky diode (D405) having its cathode connected to the base of said first input transistor (Q405).

3. A logic translator circuit as claimed in claim 2, further comprising a fourth Schottky diode (D409) and a fifth Schottky diode (D406), said fourth Schottky diode (D409) having its anode connected to said TTL ground potential and its cathode connected to the anode of said fifth Schottky diode (D406), said fifth Schottky diode (D406) having its cathode connected to the base of said second input transistor (Q406).

4. A logic translator circuit as claimed in claim 3, further comprising a third current source (30) connected between the cathode of said third Schottky diode (D405) and said negative supply potential.

5. A logic translator circuit as claimed in claim 4, further comprising a fourth current source (34) connected between the cathode of said fifth Schottky diode (D406) and said negative supply potential.

6. A logic translator circuit as claimed in claim 5, further comprising a fifth current source (36) connected between the emitter of said first emitter follower transistor (Q417) and said negative supply potential.

7. A logic translator circuit as claimed in claim 6, further comprising a sixth current source (38) connected between the emitter of said second emitter follower transistor (Q418) and said negative supply potential.

8. A logic translator circuit as claimed in claim 1, further comprising an input clamp circuit (42) coupled between said input terminal and said TTL ground potential for limiting the upper voltage on said input terminal.

9. A logic translator circuit as claimed in claim 8, further comprising a clamping transistor (Q402) having its base and collector connected to said TTL ground potential and its emitter connected to the anode of said second Schottky diode (D404).

10. A logic translator circuit as claimed in claim 9, further comprising a clamping diode (D408) having its cathode connected to said TTL ground potential and its anode connected to the cathode of said second Schottky diode (D404).

11. A logic translator circuit for converting TTL logic level signals into CML logic signals comprising:
a TTL input transistor (Q401) having its base coupled to an input terminal for receiving TTL logic level signals, its collector connected to a positive supply potential (VTTL), and its emitter connected to an internal node;

a translation chain (22) formed of a plurality of series-connected diodes, one end of said translation chain being connected to the internal node;

first CML differential switching means (24) being connected between a TTL ground potential (GTTL) and a negative supply potential (VEE) and being responsive to difference between said TTL logic level signal from the output of said translation chain and a reference voltage for generating output signals corresponding to said CML logic level signals;

level shifting means (26) being responsive to said output signals for generating first and second shifted CML output signals;

second CML differential switching means (28) being connected between a CML ground potential (GCML) and said negative supply potential and being responsive to difference between said first and second shifted CML output signals from said level shifting means for generating true and complementary CMLcompatible signals; and said CML ground potential being electrically isolated from said TTL ground potential by said level shifting means.

12. A logic translator circuit as claimed in claim 11, wherein said first CML differential switching means (24) is comprised of first and second input transistors (Q405, Q406) having their emitters connected together and a first current source (32) connected between the common emitters thereof and the negative supply potential.

13. A logic translator circuit as claimed in claim 12, wherein said second CML differential switching means (26) is comprised of third and fourth input transistors (Q419, Q420) having their emitters connected together and a second current source (40) connected between the common emitters thereof and said negative supply potential.

14. A logic translator circuit as claimed in claim 13, wherein said translation chain is comprised of a diode-connected transistor (Q409), a first Schottky diode (D401), a second Schottky diode (D404), and a third Schottky diode (D405), said diode-connected transistor (D409) having its base and collector connected to said emitter of said TTL input transistor (Q401) and its emitter connected to the anode of said first Schottky diode (D401), said first Schottky diode (D401) having its cathode connected to the anode of said second Schottky diode (D404), said second Schottky diode (D404) having its cathode connected to the anode of said third Schottky diode (D405), said third Schottky diode (D405) having its cathode connected to the base of said first input transistor (Q405).

15. A logic translator circuit as claimed in claim 14, further comprising an input clamp circuit (42) coupled between said input terminal and said TTL ground potential for limiting the upper voltage on said input terminal.

16. A logic translator circuit as claimed in claim 15, further comprising a clamping transistor (Q402) having its base and collector connected to said TTL ground potential and its emitter connected to the anode of said second Schottky diode (D404).

17. A logic translator circuit as claimed in claim 16, further comprising a clamping diode (D408) having its cathode connected to said TTL ground potential and its anode connected to the cathode of said second Schottky diode (D404).

18. A logic translator circuit for converting TTL logic level signals into CML logic signals comprising:

TTL input means including a transistor (20) having an input terminal for receiving TTL logic level signals and an internal node;

translating means (22) having an input and an output, the input of said translating means being coupled to the internal node of said TTL input means (20);

first CML differential switching means (24) being connected between a TTL ground potential (GTTL) and a negative supply potential (VEE) and being responsive to difference between said TTL logic level signal from the output of said translating means and a reference voltage for generating output signals corresponding to said CML logic level signals;

level shifting means (26) being responsive to said output signals for generating first and second shifted CML output signals;

second CML differential switching means (28) being connected between a CML ground potential (GCML) and said negative supply potential and being responsive to difference between said first and second shifted CML output signals from said level shifting means for generating true and complementary CML-compatible signals; and said CML ground potential being electrically isolated from said TTL ground potential by said level shifting means.

19. A logic translator circuit as claimed in claim 18, wherein said first CML differential switching means (24) is comprised of first and second input transistors (Q405, Q406) having their emitters connected together and a first current source (32) connected between the common emitters thereof and the negative supply potential.

20. A logic translator circuit as claimed in claim 19, wherein said second CML differential switching means (26) is comprised of third and fourth input transistors (Q419, Q420) having their emitters connected together and a second current source (40) connected between the common emitters thereof and said negative supply potential.

* * * * *